(12) United States Patent
Kasai et al.

(10) Patent No.: US 7,551,151 B2
(45) Date of Patent: *Jun. 23, 2009

(54) ELECTRONIC CIRCUIT, ELECTROLUMINESCENT DISPLAY DEVICE, ELECTRO-OPTICAL DEVICE, ELECTRONIC APPARATUS, METHOD OF CONTROLLING THE CURRENT SUPPLY TO AN ORGANIC ELECTROLUMINESCENT PIXEL, AND METHOD FOR DRIVING A CIRCUIT

(75) Inventors: Toshiyuki Kasai, Okaya (JP); Simon Tam, Cambridge (JP)

(73) Assignee: Seiko Epson Corporation, Tokyo (JP)

( * ) Notice: Subject to any disclaimer, the term of this patent is extended or adjusted under 35 U.S.C. 154(b) by 491 days.

This patent is subject to a terminal disclaimer.

(21) Appl. No.: 11/266,532

(22) Filed: Nov. 4, 2005

(65) Prior Publication Data

US 2006/0208972 A1 Sep. 21, 2006

Related U.S. Application Data

(62) Division of application No. 10/337,988, filed on Jan. 8, 2003, now Pat. No. 7,138,968.

(30) Foreign Application Priority Data

Jan. 9, 2002 (GB) .................................. 0200411.7

(51) Int. Cl.
*G09G 3/30* (2006.01)
(52) U.S. Cl. .......................................... 345/76; 345/82
(58) Field of Classification Search ............. 345/76–82, 345/84, 87, 90, 204; 315/169.1, 169.3
See application file for complete search history.

(56) References Cited

U.S. PATENT DOCUMENTS

| 5,714,968 | A | 2/1998 | Ikeda |
| 5,723,950 | A | 3/1998 | Wei et al. |
| 6,091,203 | A | 7/2000 | Kawashima et al. |
| 6,229,506 | B1 | 5/2001 | Dawson et al. |
| 6,246,180 | B1 * | 6/2001 | Nishigaki ..................... 345/76 |
| 6,356,029 | B1 | 3/2002 | Hunter |
| 6,359,605 | B1 | 3/2002 | Knapp et al. |
| 6,373,454 | B1 | 4/2002 | Knapp et al. |
| 6,501,466 | B1 | 12/2002 | Yamagishi et al. |
| 6,839,057 | B2 * | 1/2005 | Iguchi ........................ 345/204 |
| 7,138,968 | B2 * | 11/2006 | Kasai et al. .................... 345/76 |

FOREIGN PATENT DOCUMENTS

| CN | 1312535 A | 9/2001 |
| EP | 0365445 A2 | 4/1990 |
| EP | 1132882 A2 | 9/2001 |
| EP | 1 170 718 | 1/2002 |
| GB | 2 360 870 | 10/2001 |
| GB | 2360870 A2 | 10/2001 |

(Continued)

*Primary Examiner*—Regina Liang
(74) *Attorney, Agent, or Firm*—Oliff & Berridge, PLC

(57) ABSTRACT

The invention provides an electronic circuit that can include a programming path and a reproduction path. The circuit can further include a current driven element, a transistor in the production path arranged so as to operatively control a current supplied to the current driven element, a capacitor arranged for storing an operating voltage of the transistor, an additional transistor arranged in parallel to the transistor in the programming path for storing the capacitor and the operating voltage, and a switching device that controls the programming path and the reproduction path.

14 Claims, 16 Drawing Sheets

FOREIGN PATENT DOCUMENTS

| | | |
|---|---|---|
| JP | 11-282419 A | 10/1999 |
| JP | A 2000-352959 | 12/2000 |
| JP | 2003-099001 A | 4/2003 |
| JP | A 2003-150104 | 5/2003 |
| JP | 2003-177710 A | 6/2003 |
| WO | WO 01/75853 | 10/2001 |

* cited by examiner

Related Art

FIG. 3A
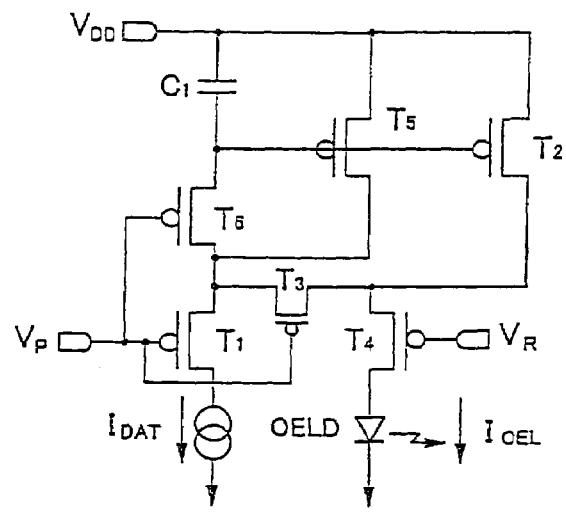
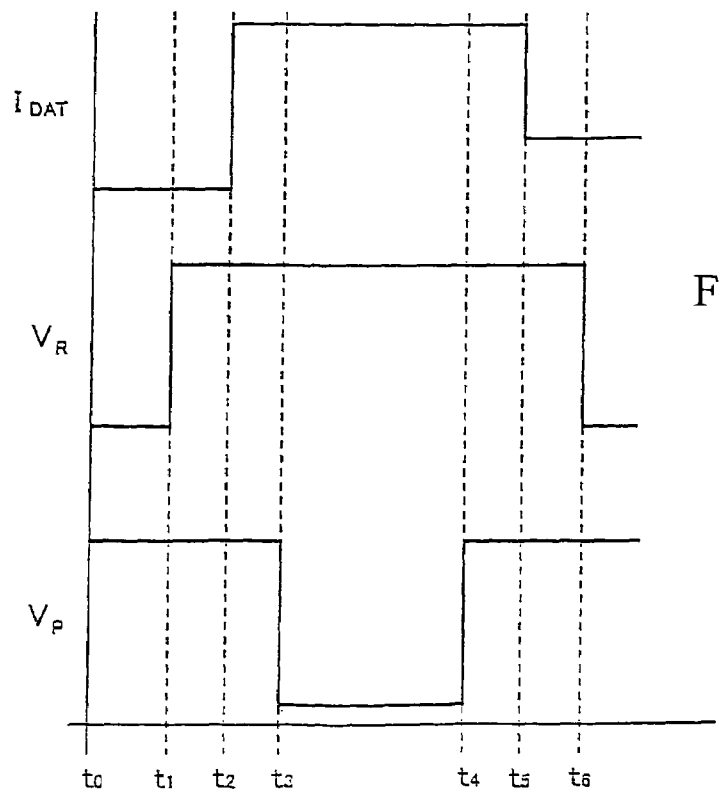
FIG. 3B

|  | $I_{DAT}$ | $I_{OEL}$ |
|---|---|---|
| the circuit in Fig.2 | 100 η A | 100 η A |
| the invention | 1 μ A | |

FIG. 8A
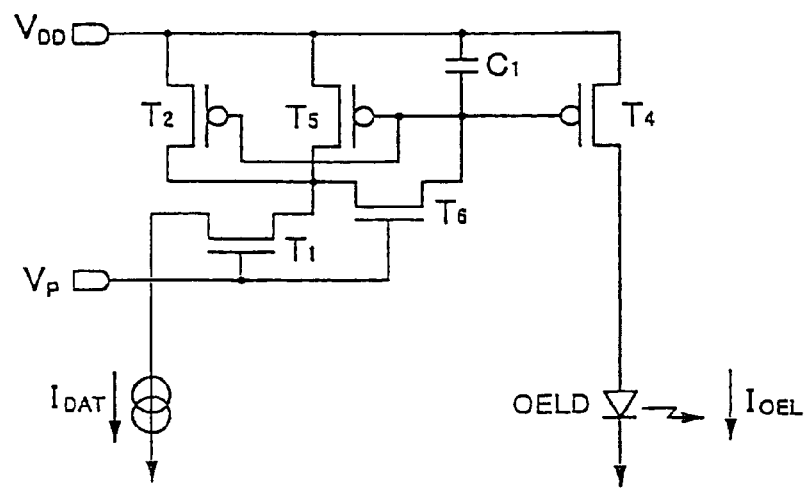
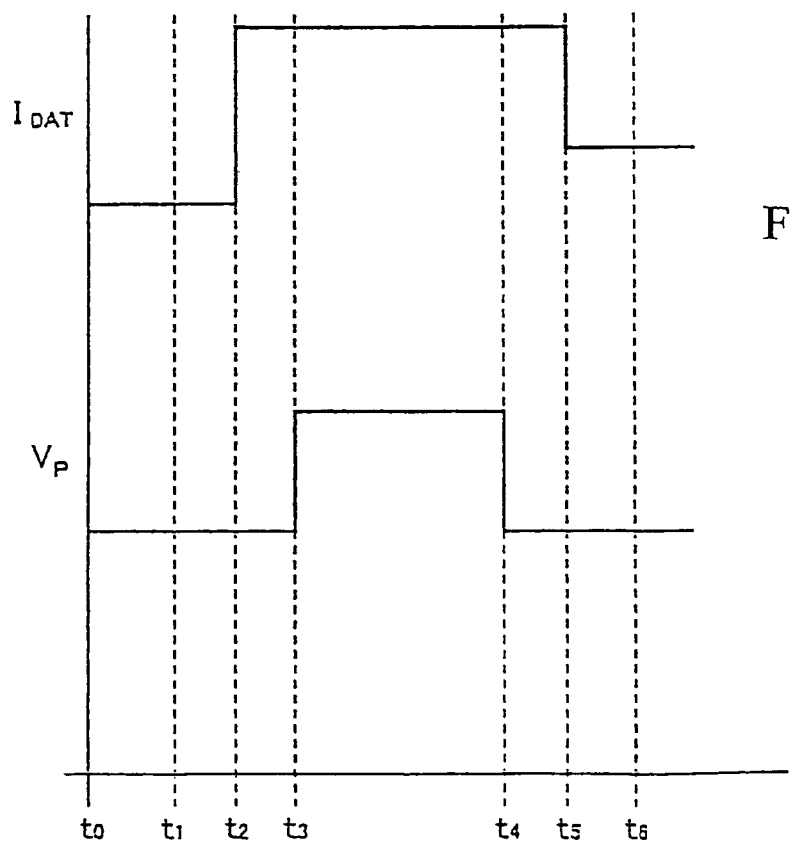
FIG. 8B

FIG. 9A
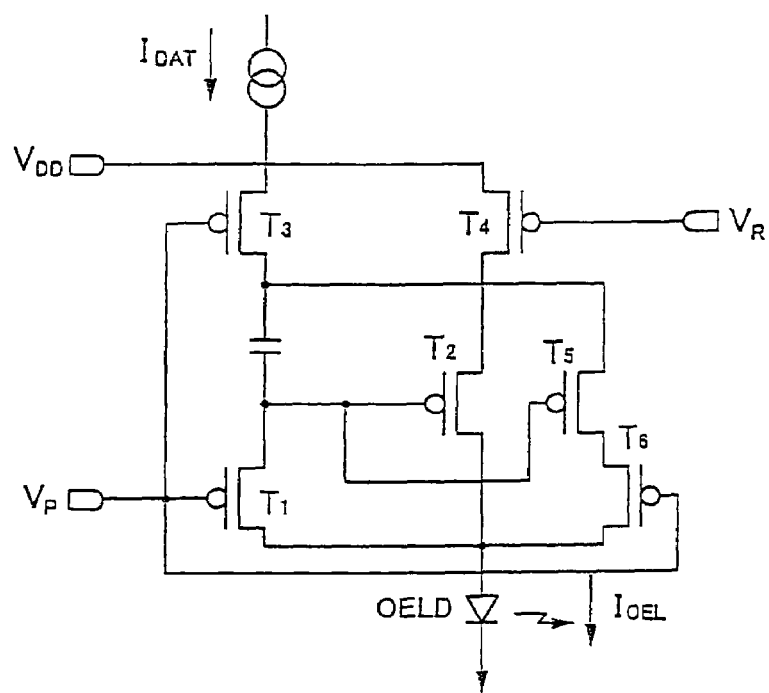
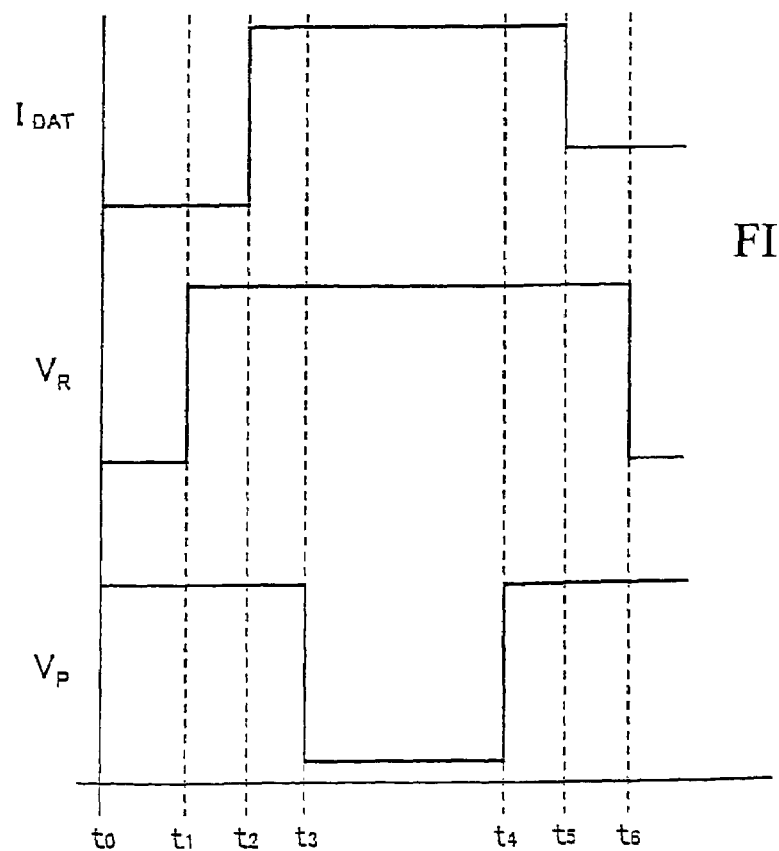
FIG. 9B

ELECTRONIC CIRCUIT, ELECTROLUMINESCENT DISPLAY DEVICE, ELECTRO-OPTICAL DEVICE, ELECTRONIC APPARATUS, METHOD OF CONTROLLING THE CURRENT SUPPLY TO AN ORGANIC ELECTROLUMINESCENT PIXEL, AND METHOD FOR DRIVING A CIRCUIT

CROSS-REFERENCE TO RELATED APPLICATION

This is a Division of application Ser. No. 10/337,988 filed Jan. 8, 2003 now U.S. Pat. No. 7,138,968. The entire disclosure of the prior application is hereby incorporated by reference herein in its entirety.

BACKGROUND

The present invention relates to an electronic circuit with one particular application of such an electronic circuit being as a circuit for driving a pixel of an organic electroluminescent device.

An organic electroluminescent (OEL) element can include a light emitting material layer sandwiched between an anode layer and a cathode layer. Electrically, this element operates like a diode. Optically, it emits light when forward biased, and the intensity of the emission increases with the forward bias current. It is possible to construct a display panel with a matrix of OEL elements fabricated on a transparent substrate and with at least one of the transparent electrode layers, one can also integrate the driving circuit on the same panel by using low temperature polysilicon thin film transistor (TFT) technology.

In a basic analog driving scheme for an active matrix OEL display, a minimum of two transistors are required per pixel (FIG. 1). $T_1$ is for addressing the pixel and $T_2$ is for converting the data voltage signal, to a driver current for an OELD to emit light at a designated brightness. This data signal is stored by the storage capacitor, $C_{storage}$, when the pixel is not addressed. Although p-channel TFTs are shown in the figures, the same principle can also be applied for a circuit with n-channel TFTs.

SUMMARY

The pixel driver circuit (electronic circuit), as shown in FIG. 2, can include a transistor $T_2$ that operates as an analog current controller to provide the driving current to the OELD. Further, the storage capacitor $C_1$ is connected between the gate and source terminals of $T_2$. In a circuit shown in FIG. 2, the drain of the transistor $T_2$ is connected to the source of the transistor $T_1$ via the source-drain path of the transistor $T_3$. The source of the transistor $T_1$ is connected to the gate of the transistor $T_2$ and the gates of the $T_1$ and $T_3$ are connected to each other. The gates of the $T_1$ and $T_3$ are applied with a programming voltage $V_p$. The transistor $T_4$ which is turned off during a programming stage, connects the drain of the $T_2$ and the source of the $T_3$ to the OELD. During the programming stage, the transistor $T_1$ connects the $T_2$ to a current sink which is grounded or which is connected to a reference voltage. At this stage, the current which flows into the OEL element via the transistor $T_2$ is 0.

In the circuit of FIG. 2, $T_4$ is OFF, and $T_1$ and $T_3$ are ON in the programming stage. The $T_3$ which is ON has an effect of operating the $T_2$ as a diode. Further, the $T_1$ connects this diode to the data current sink. As a result, the storage capacitor $C_1$ stores (stores the charge) (or discharges, depending on the voltage stored during the previous frame). Storage capacitor $C_1$ charges to the gate/source voltage of transistor $T_2$, and thus stores the voltage ($V_{GS2}$, corresponding to the data current $I_{DAT}$), which will control the current supply to the OEL element during the reproduction stage. At the end of the programming stage, $T_1$ and $T_3$ are switched off. The voltage $V_{GS2}$ is noted on $C_1$ for the remainder of the frame period (that is, in the reproduction stage).

The off resistance of $T_3$ can be important, because after $C_1$ has been charged and $T_3$ is switched off, the off resistance of $T_3$ can affect the voltage across $C_1$ for the rest of the frame period. Thus, the gate/source capacitance of $T_3$ should preferably be small compared with $C_1$.

The reproduction voltage $V_R$ is applied to the gate of transistor $T_4$. At the beginning of the reproduction stage, in the circuit of FIG. 2, $T_4$ is switched on and $T_1$ and $T_3$ remain switched off. As a result, $T_2$ acts as a current source with $V_{GS2}$ biased by $C_1$, thus supplying current to the OEL element. At the end of the reproduction stage $T_4$ is switched off, and $T_1$ and $T_3$ remain switched off. This completes one cycle. The driving waveform is indicated in FIG. 2.

It will be noted that according to the circuit shown in FIG. 2, no current is supplied to the current driven element by the current controlling transistor during the programming stage. In accordance with the present invention in an electroluminescent device a pixel driver circuit can be implemented without degrading the perceived image presented by the electroluminescent device. In effect, the present invention provides for separation of the programming and the reproduction current paths. This enables a number of advantages to be achieved. For example, if there is no current flow through the OEL element during the programming stage then the programming stage operates more quickly since the arrangement avoids the slow down caused by the parasitic capacitance of the OEL element.

The circuit of FIG. 2 is effective, but there is still a need to lower the consumption electric power. Therefore, with the improvement of the materials of the recent OEL element, the circuit may be driven even with a small current.

However, particularly, when expressing a low gradient, it is necessary for the data current $I_{DAT}$ to be made extremely small in the programming stage, and there are problems, such as the charging speed to the storage capacitor $C_1$ becoming slow. In addition when programming is performed by a small data current $I_{DAT}$, due to a variation in manufacture of the storage capacitor $C_1$ and a data line, the charging speed and the stored charge to the storage capacitor $C_1$ may be seen.

According to a first aspect of the present invention there is provided an electronic circuit having both a programming path and a reproduction path, the circuit can include a current driven element, a transistor in the production path arranged so as operatively to control a current supplied to the current driven element, a capacitor arranged for storing an operating voltage of the transistor, an additional transistor arranged so as to be in parallel to the transistor in the production path, for storing the operating voltage in the capacitor, and a switching device for controlling the programming path and the reproduction path.

According to a second aspect of the present invention there is provided an electronic circuit for driving a pixel of an electroluminescent device. The pixel can include an electroluminescent element. The circuit can include a transistor arranged so as operatively to control the current supplied to the electroluminescent element, a capacitor arranged for storing an operating voltage of the transistor during a programming stage, an additional transistor arranged in parallel to the transistor for storing the operating voltage to the capacitor, a first switching device that is connected so as operatively to establish a current path through the transistor and the additional transistor during the programming stage, and a second switching device that is connected so as to operatively establish a current path through the transistor and the electroluminescent element during a reproduction stage.

According to a third aspect of the present invention, there is provided an electronic circuit for driving a pixel of an electroluminescent device. The pixel can include an electroluminescent element. The circuit can include a transistor connected so as operatively to control the current supplied to the electroluminescent element, a capacitor connected for storing an operating voltage of the transistor during a programming stage, an additional transistor connected in parallel with the transistor for storing the operating voltage in the capacitor, a first switching device that is connected so as to establish a current path through the transistor and the additional transistor during the programming stage, a second switching device that is connected so as to establish when operative a current path through the transistor and the electroluminescent element during a reproduction stage, and a current sink, and the first switching device that is arranged such that the current path in the programming stage is connected to the current sink via the transistor and the additional transistor.

According to a fourth aspect of the present invention, there is provided an electronic circuit having a current driven element, a data line for outputting a current as a data signal, a capacitor for storing charge based on current output via the data line, a plurality of transistors arranged in parallel to each other as well as the capacitor being connected to the gate, and a driver transistor arranged in series to the current driven element. The electronic circuit can supply current according to the charge stored in the capacitor based on the current amount flowing in the current path including the plurality of transistors in a state the plurality of transistors are connected to the data line via the driven transistor.

According to a fifth aspect of the present invention there is provided an electronic circuit for driving the pixel of the electroluminescent device, the pixel can include the electroluminescent element. The circuit can include a current driven element, a data line for outputting a current as a data signal, a capacitor for storing charge based on the current output via the data line, a plurality of transistors with the capacitor being connected to a gate, and a driven transistor arranged in series to the current driven element. The electronic circuit can supply a current according to the charge stored in the capacitor based on the current amount flowing in the current path including the plurality of transistors in a state where the plurality of transistors are connected to the data line via the driven transistor ($T_4$) to the current driven element. The circuit can further include a switching device for forming a programming path through the plurality of transistors, and a current sink, and the switching device is arranged to connect to the current sink via the plurality of transistors in the programming path.

According to a sixth aspect of the present invention there is provided an electronic circuit having a current driven element, a data line for outputting a current as a data signal, a capacitor for storing charge based on a current output via the data line, a plurality of transistors arranged in parallel to each other as well as the capacitor being connected with a gate, and a driver transistor arranged in series to the current driven element. The electronic circuit supplies current according to the charge stored in the capacitor based on the current amount flowing in the current path including the plurality of transistors in a state the plurality of transistors are connected to the data line via at least one of the plurality of transistors.

According to a seventh aspect of the present invention there is provided an electronic circuit for driving a pixel of the electroluminescent device, the pixel can include the electroluminescent element. The circuit can further include a current driven element, a data line for outputting a current as a data signal, a capacitor for storing charge based on current output via the data line in the programming stage, and a plurality of transistors with the capacitor being connected to the gate. The electronic circuit supplies current according to the charge stored in the capacitor based on the current amount flowing in the current path including the plurality of transistors in a state the plurality of transistors are connected to the data line via the driven transistor to the current driven element. Additionally, the circuit can include a first switching device for operatively generating a current path through the plurality of transistors in the programming stage, and a second switching device for operatively generating a current path through at least one of the plurality of transistors and the electroluminescent element in the reproduction stage.

According to an eighth aspect of the present invention there is provided an electroluminescent display device having one or more electronic circuit.

According to a ninth aspect of the present invention there is provided an electronic apparatus incorporating an electroluminescent display device.

According to a tenth aspect of the present invention there is provided a method of controlling a current supply to an electroluminescent element including the steps of providing a programming path including a plurality of auxiliary (or sub-) current paths, and providing a reproduction path which passes through the electroluminescent element.

According to an eleventh aspect of the present invention there is provided a method of controlling a current supply to an electroluminescent element including the steps of providing a programming path including a plurality of auxiliary (or sub-) current paths which connects to a current sink and providing a reproduction path which passes through the electroluminescent element.

According to this invention, since data current may be large, the programming operation may be performed more quickly.

BRIEF DESCRIPTION OF THE DRAWINGS

The invention will be described with reference to the accompanying drawings, wherein like numerals reference like elements, and wherein:

FIGS. 3A and 3B show a pixel driver circuit according to a first embodiment of the present invention and corresponding driving waveform;

FIGS. 8A and 8B show another embodiment of a pixel driver circuit according to the present invention and corresponding driving waveform;

FIGS. 9A and 9B show further another embodiment of a pixel driver circuit according to the present invention and corresponding driving waveform;

DETAILED DESCRIPTION OF EMBODIMENTS

The embodiments of the present invention are described referring to the attached drawings with further examples. These are of course only examples. In this embodiment, in respect to the circuit shown in the above described FIG. 2, common portions regarding the structure, operation and operating effects are as described above, and the differing portions are mainly described.

Figure 1:
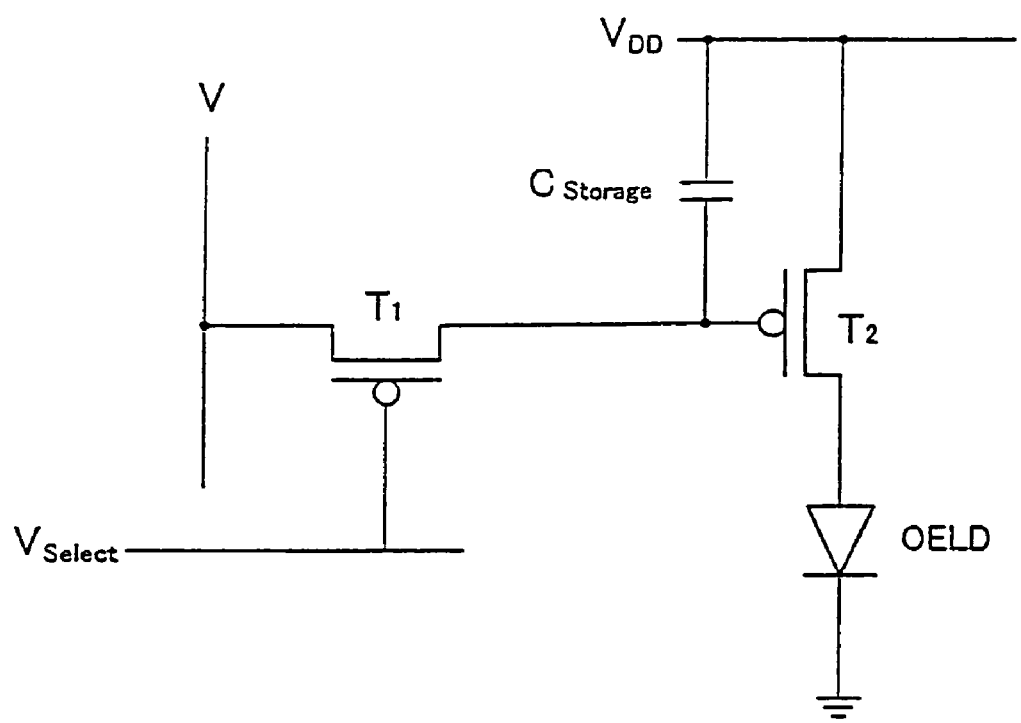
FIG. 1 shows a conventional OEL element pixel driver circuit using two transistors.
Figure 2A:
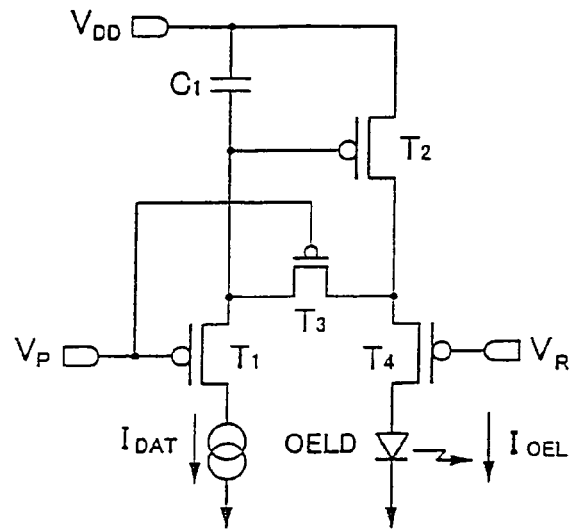
FIGS. 2A and 2B show a known current programmed OEL element driver circuit and corresponding driving waveform.
Figure 2B:
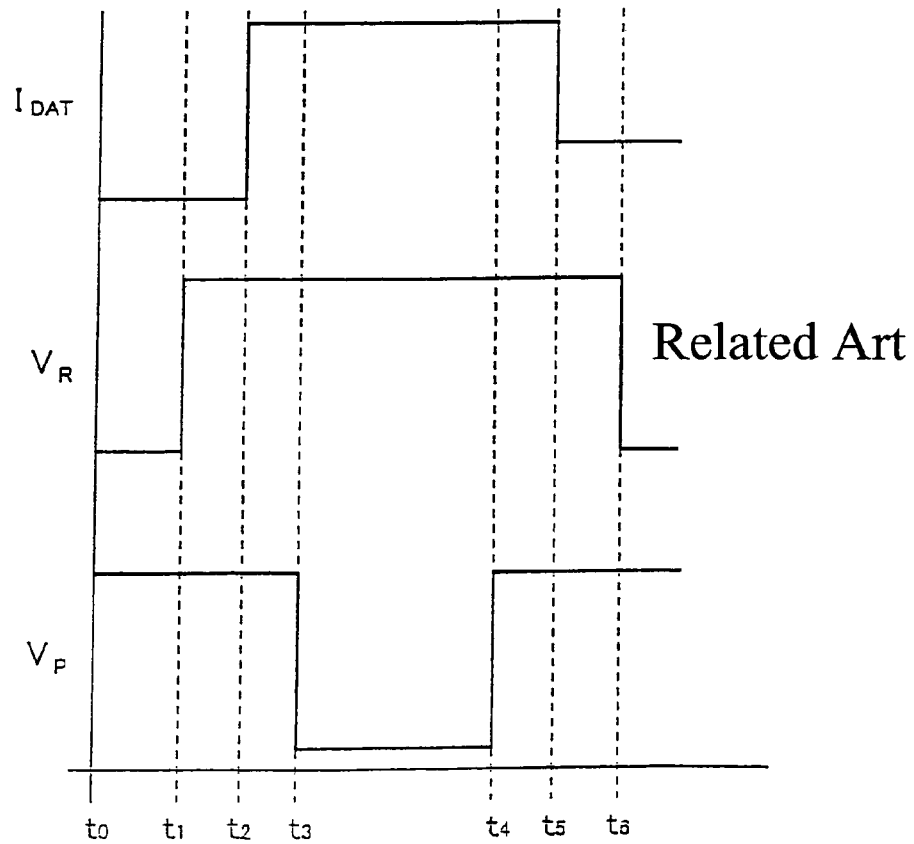

As shown in FIG. 3A, the circuit of this embodiment can include, first, in addition to the circuit shown in FIG. 2 described above, an additional transistor $T_5$ and an additional switching transistor $T_6$. These $T_5$ and $T_6$ are p-type transistors. The source of the switching transistor $T_6$ is connected to the storage capacitor $C_1$, and the drain thereof is connected to the source of the p-type transistor $T_1$. The gates of the additional switching transistor $T_6$, $T_1$, and the p-type transistor $T_3$ are connected to each other. The gates of $T_1$, $T_3$, and $T_6$ are applied with a programming voltage Vp. The $T_1$ is connected to $C_1$ via the drain and source of the $T_6$.

The source of the additional $T_5$ is connected to $V_{DD}$ and its gate is connected to the storage capacitor $C_1$, and is applied with the same driver voltage signal as the gate of the transistor $T_2$. The drain of transistor $T_5$ is connected to the common point of connection of to the transistors $T_1$, $T_3$, and $T_6$. That is, the storage capacitor $C_1$ is also connected between the gate and source of the additional transistor $T_5$.

In the circuit of FIG. 3A, the programming voltage Vp is applied to the gates of transistors $T_1$ and $T_3$, and $T_6$. The p-type transistor $T_4$ which is switched off during the programming stage, connects the drain of the p-type transistor $T_2$ and the source of $T_3$ to the OEL element. During the programming stage, the transistor $T_1$ operatively connects transistor $T_2$, $T_5$ to a current sink, which is tied to ground or to a reference voltage.

The circuit of FIG. 3A operates in the programming stage with $T_4$ switched off and $T_1$, $T_3$ and $T_6$ switched on. $T_3$ and $T_6$ being switched on have the effect of making $T_2$ and $T_5$ act as diodes. Further, $T_1$ connects this diode $T_2$ and $T_5$ to the data current sink. As a result, the storage capacitor $C_1$ charges (or discharges, depending on the voltage stored during the previous frame). Storage capacitor $C_1$ charges to the gate/source voltage of transistor $T_2$ and $T_5$, thus stores the voltage ($V_{GS2}$, corresponding to the data current $I_{DAT}$), which will control the current supply to the OEL element during the reproduction stage. Here, the data current $I_{DAT}$ is a data signal output by the data line. At the end of the programming stage, $T_1$, $T_3$ and $T_6$ are switched off. The voltage $V_{GS2}$ is stored on $C_1$ for the remainder of the frame period, that is for the reproduction stage.

Figure 4:
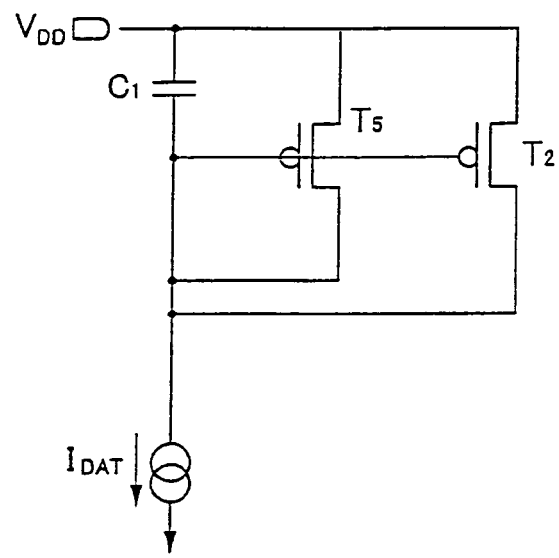
FIG. 4 shows an equivalent circuit in a programming stage of a pixel driver circuit according to an embodiment of the present invention.

More specifically, the circuit in FIG. 3A in the programming stage, operates as the circuit shown in FIG. 4. That is, in FIG. 4, the programming paths from the two auxiliary (or sub-) current paths including the two transistors $T_2$ and $T_5$ which operate as diodes are formed.

Figure 5:
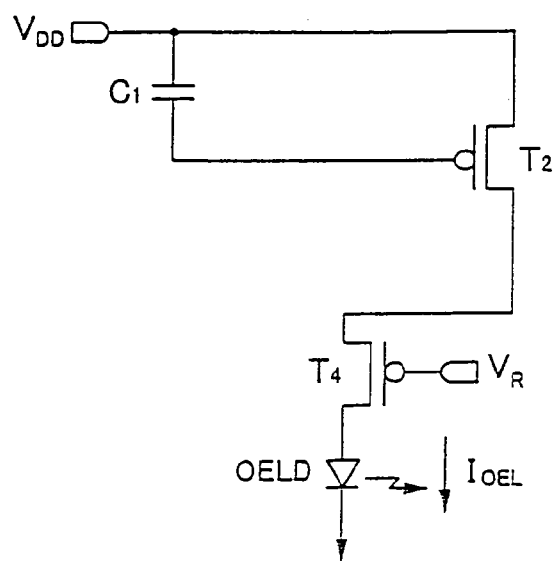
FIG. 5 shows an equivalent circuit in a reproduction stage of a pixel driver circuit according to an embodiment of the present invention.

The reproduction voltage $V_R$ is applied to the gate of transistor $T_4$. At the beginning of the reproduction stage, in the circuit of FIG. 3A, $T_4$ is switched on and $T_1$, $T_3$ and $T_6$ remain switched off. As a result, the reproduction path as shown in FIG. 5 is formed, $T_2$ acts as a current source with $V_{GS2}$ biased by $C_1$, thus supplying current to the OEL element. At the end of the reproduction stage $T_4$ is switched off, $T_1$, $T_3$ and $T_6$ remain switched off. This completes one cycle. This driving waveform is indicated in FIG. 3B.

Figures 6A, 6B:
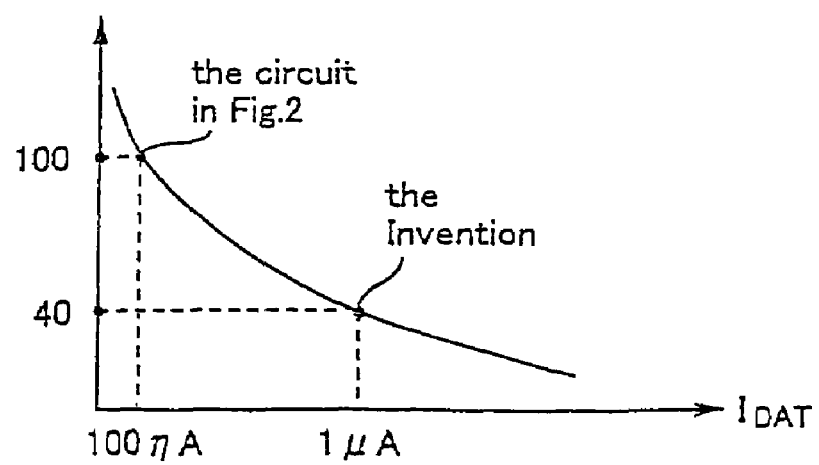
FIGS. 6A and 6B are a table and a diagram related to a data current value and a programming stage operation speed, and compares a pixel driver circuit of an embodiment according to the present invention and a pixel driver circuit of FIG. 2.

As described above and shown in FIG. 4, during the programming stage, two auxiliary (or sub-) current paths including the two transistors $T_2$ and $T_5$ which operate as diodes are formed. Accordingly, for example, if the ratio of the current supply power of the $T_2$ and $T_5$ are set as 1:9, as in FIG. 6A, if the current $I_{OEL}$ supplied to the electroluminescent element in the production stage is the same 100 [nA], as compared to the circuit shown in FIG. 2 in which the data current $I_{DAT}$ is 100 [nA], this embodiment may be increased 10 times to 1 [μA]. As a result, as shown in FIG. 6B, the programming stage period (programming time) in which the data current $I_{DAT}$ flows, may be made extremely short as 40 [μS] compared to the 100 [μS] in the circuit as shown in FIG. 2. Therefore, a big increase in speed of the programming operation can be achieved. The comparison shown in FIG. 6B is of course only one example.

Figure 7:
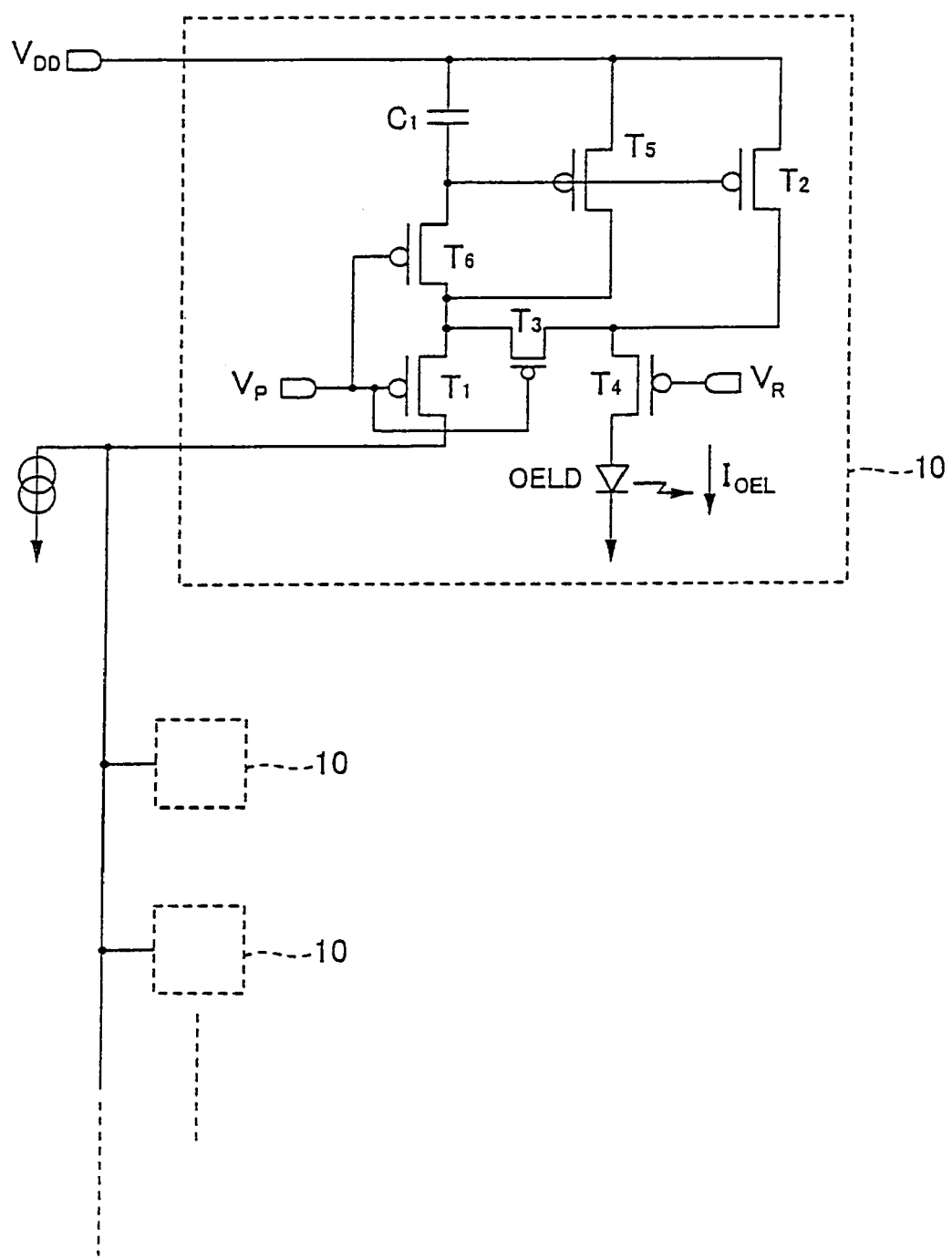
FIG. 7 is an example of a circuit diagram applying an OEL element and a pixel driver circuit to a display in an embodiment of the present invention.

In the organic electroluminescent element device, an example of mounting the driver circuit of FIG. 3A is shown in FIG. 7. In the circuit of FIG. 7, a plurality of circuit blocks 10 are connected to a common current sink.

As other embodiments, circuit examples are shown in FIGS. 8A and 9A. In the circuit of FIG. 8A, transistors $T_1$ and $T_6$ are turned on, and the two auxiliary (or sub-) current paths including the two transistors $T_2$ and $T_5$ which operate as diodes are formed. Then, at the start of the reproduction stage, $T_4$ is turned on and $T_1$ and $T_6$ remain turned off. As a result, as shown in FIG. 8A, $T_4$ acts as a current source with $V_{GS2}$ biased by $C_1$, thus supplying current to the OEL element. At the end of the reproduction stage $T_4$ is switched off, $T_1$ and $T_6$ remain switched off. This completes one cycle. This driving waveform is indicated in FIG. 8B. As in the embodiment of FIG. 8A, similarly to the circuit of FIG. 3A described above, the data current $I_{DAT}$ may be increased, and the programming operation may be made quicker. For example, if $T_2$, $T_4$ and $T_5$ are structured as a same characteristic transistor, the characteristics of the transistors may be easily matched, and also a state of $I_{DAT}:I_{OEL}=2:1$ may be realized.

As shown in FIG. 9A, during the programming stage, transistors $T_1$, $T_3$ and $T_6$ are turned on, and two auxiliary (or sub-) current paths including the two transistors $T_2$ and $T_5$ which operate as diodes are formed. Accordingly, at the start of the reproduction stage, $T_4$ is turned on and $T_1$, $T_3$ and $T_6$ remain turned off. As a result, as shown in FIG. 9A, $T_4$ acts as a current source with $V_{GS2}$ biased by $C_1$, thus supplying current to the OEL element. At the end of the reproduction stage $T_4$ is switched off, and $T_1$, $T_3$ and $T_6$ remain switched off. This completes one cycle. The driving waveform is indicated in FIG. 9B. As in the embodiment of FIG. 9A, similarly to the circuit of FIG. 3A described above, the data current $I_{DAT}$ may be increased, and the programming operation may be made quicker. For example, if $T_2$ and $T_5$ are structured as a same characteristic transistor, the characteristics of the transistors may be easily matched, and also a state of $I_{DAT}$:$I_{OEL}$=2:1 may be realized.

Figure 10:
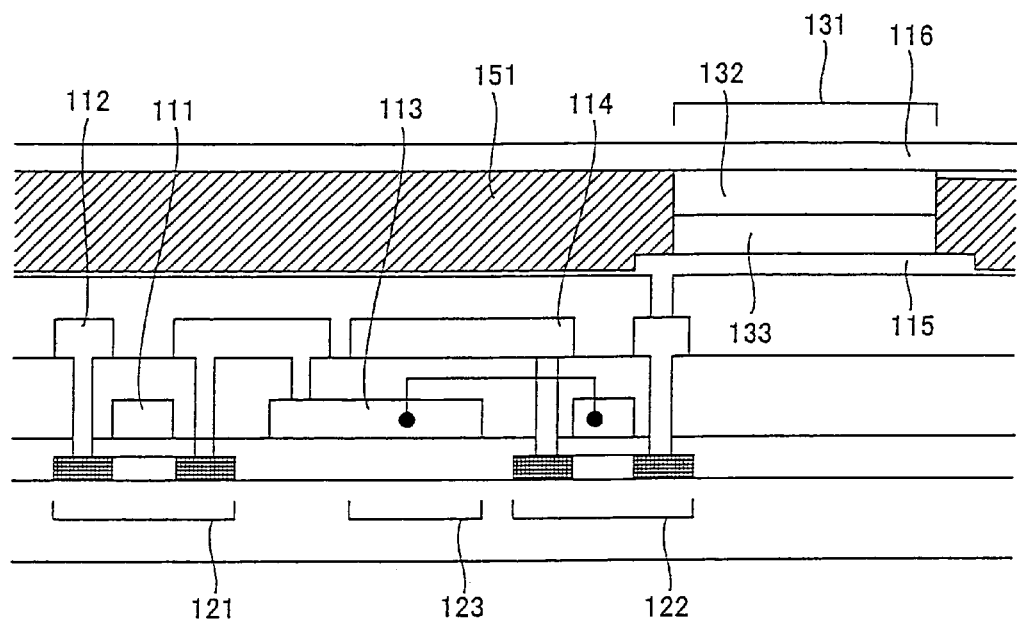
FIG. 10 is a schematic sectional view showing an OEL element device mounted with a pixel driver circuit according to the present invention.

FIG. 10 is a schematic cross-sectional view of a certain OEL element device. In FIG. 10, numeral 132 indicates a hole injection layer, numeral 133 indicates an organic EL layer, and numeral 151 indicates a resistor or a separating structure formed by an insulating film. The switching thin-film transistor 121 and the p-channel type current thin-film transistor 122 adopt the structure and the process ordinarily used for a low temperature polysilicon thin-film transistor liquid crystal display devices, such as a top-gate structure and a fabrication process, wherein the maximum temperature is 600□ or less. However, other structures and processes are applicable.

The organic EL display element 131 is formed by the cathode 116 formed of A1, the anode 115 formed of ITO, the hole injection layer 132, and the organic EL layer 133.

The hole injection layer 132 and the organic EL layer may be formed by a technique, such as an ink-jet printing method or a mask evaporation method, employing the resist 151 as a separating structure between the pixels. The opposite anode 115 formed of ITO may be formed using a sputtering method. However, other methods may also be used for forming all of these components. For example, an electron transporting layer may be arranged in between the light emitting layer and the cathode.

Figure 11:
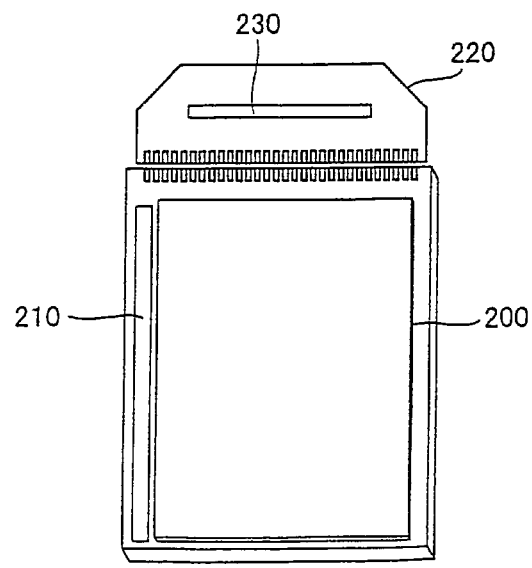
FIG. 11 is a schematic plan view of an OEL display panel according to the present invention.

The typical layout of a full display panel employing the present invention is shown schematically in FIG. 11. The panel can include an active matrix OEL element 200 with analogue current program pixels, an integrated TFT scanning driver 210 with level shifter, a flexible TAB tape 220, and an external analogue driver LSI 230 with an integrated RAM/controller. Of course, this is only one example of the possible panel arrangements in which the present invention can be used.

It should be understood that the structure of the organic EL display device is not limited to the one described here. Other structures are also applicable without departing from the spirit and scope of the present invention.

Preferably the circuits shown in FIGS. 3A to 11 are implemented using thin film transistor (TFT) technology, most preferably in polysilicon TFT.

The present invention is particularly advantageous for use in small, mobile electronic products such as mobile phones, computers, CD players, DVD players and the like, although it is not limited thereto.

For example, several electronic apparatuses using the above organic electroluminescent display device will now be described.

Figure 12:
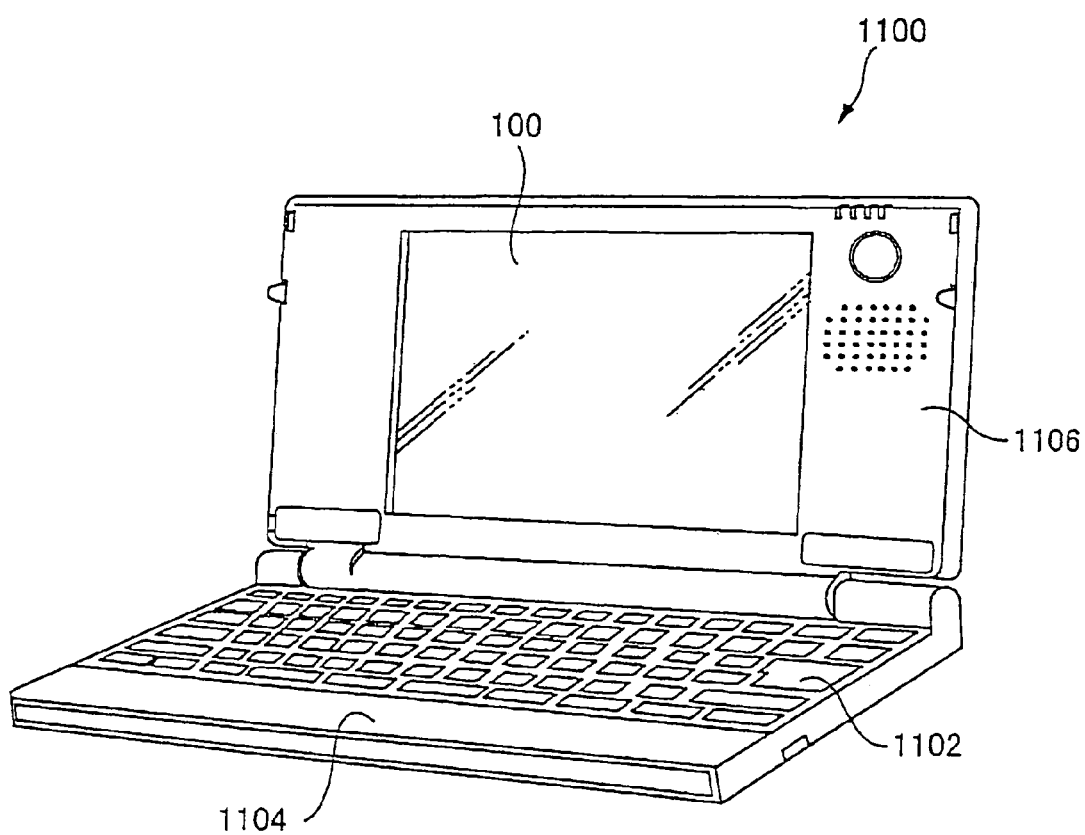
FIG. 12 is a schematic view of a mobile personal computer incorporating a display device having a pixel driver circuit according to the present invention.

An example in which the display device according to one of the above embodiments is applied to a mobile personal computer will now be described. FIG. 12 is an isometric view illustrating the configuration of the personal computer. In the drawing, the personal computer 1100 is provided with a body 1104 including a keyboard 1102 and a display unit 1106. The display unit 1106 is implemented using a display panel fabricated according to the present invention, as described above.

Figure 13:
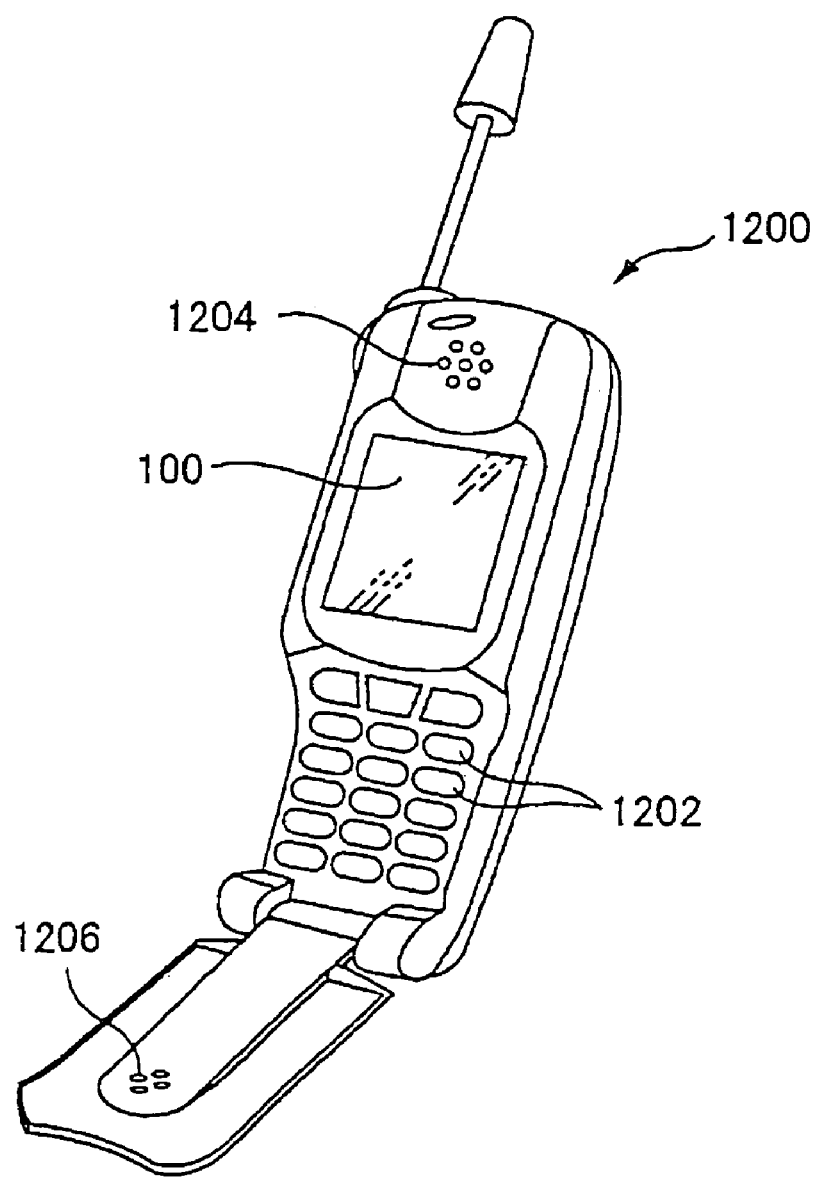
FIG. 13 is a schematic view of a mobile telephone incorporating a display device having a pixel driver circuit according to the present invention.

Next, an example in which the display device of the present invention is applied to a display section of a portable phone will be described. FIG. 13 is an isometric view illustrating the configuration of the portable phone. In the drawing, the portable phone 1200 is provided with a plurality of operation keys 1202, a speaker 1204, a mouthpiece 1206, and a display panel 100. This display panel 100 is implemented using a display panel fabricated according to the present invention, as described above.

Figure 14:
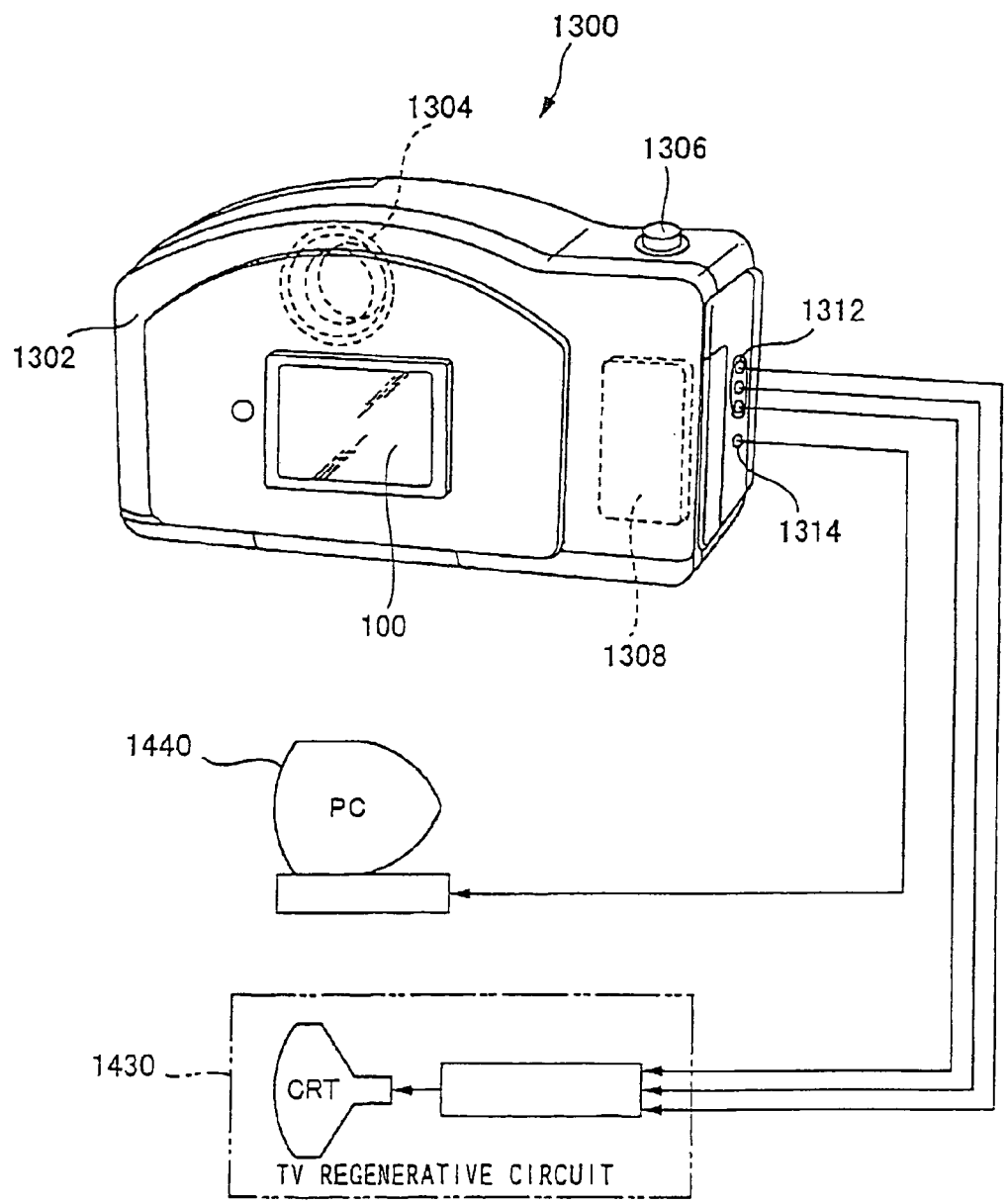
FIG. 14 is a schematic view of a digital camera incorporating a display device having a pixel driver circuit according to the present invention.

Next, a digital still camera using an OEL display device as a finder will be described. FIG. 14 is an isometric view illustrating the configuration of the digital still camera and the connection to external devices in brief.

Typical cameras sensitize films based on optical images from objects, whereas the digital still camera 1300 generates imaging signals from the optical image of an object by photoelectric conversion using, for example, a charge coupled device (CCD). The digital still camera 1300 is provided with an OEL element 100 at the back face of case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and the input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 is output to the television monitor 1430 and the personal computer 1440, by a given operation.

Examples of electronic apparatuses, other than the personal computer shown in FIG. 12, the portable phone shown in FIG. 13, and the digital still camera shown in FIG. 14, can include OEL element television sets, view-finder-type and monitoring-type video tape recorders, car navigation systems, pagers, electronic notebooks, portable calculators, word processors, workstations, TV telephones, point-of sales system (POS) terminals, devices provided with touch panels, and the like. Of course, the above OEL device can be applied to display sections of these electronic apparatuses.

The driver circuit of the present invention can be disposed not only in a pixel of a display unit but also outside a display unit.

In the above description, the driver circuit of the present invention has been described with reference to various display devices. However, it should be understood that the applications of the driver circuit of the present invention are much broader than just display devices and include, for example, its use with a magneto resistive RAM, a capacitance sensor, a charge sensor, a DNA sensor, a night version camera and many other devices.

Figure 15:
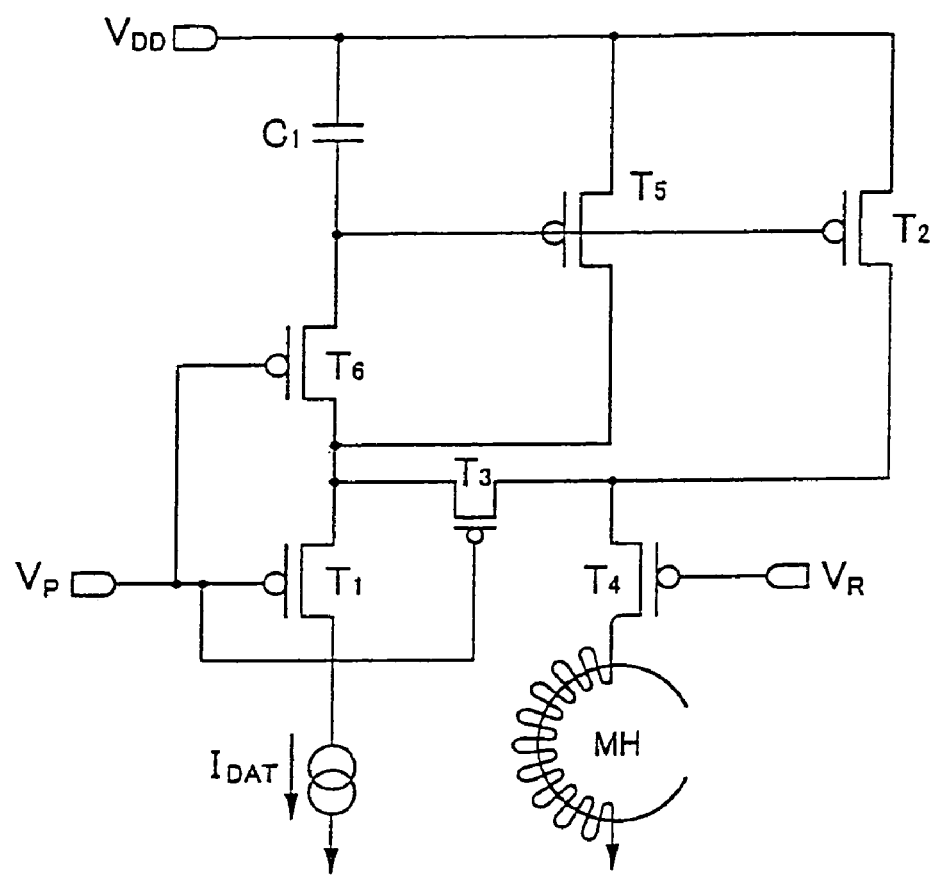
FIG. 15 illustrates an application of a driver circuit of the present invention to a magnetic RAM.

FIG. 15 illustrates the application of the driver circuit of the present invention to a magnetic RAM. In FIG. 15 a magnetic head is indicated by the reference MH.

Figure 16:
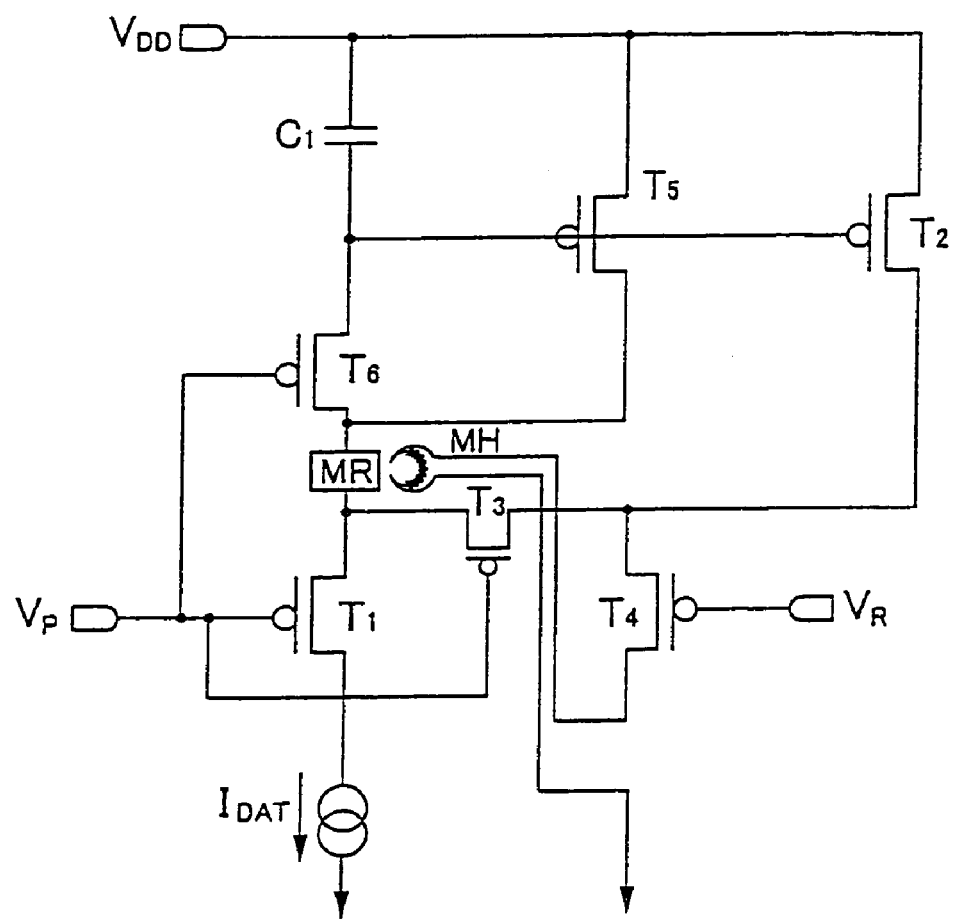
FIG. 16 illustrates an application of a driver circuit of the present invention to a magneto resistive element.

FIG. 16 illustrates an alternative application of the driver circuit of the present invention to a magnetic resistance element. In FIG. 16 a magnetic head is indicated by the reference MH, and a magnetic resistor is indicated by the reference MR.

Figure 17:
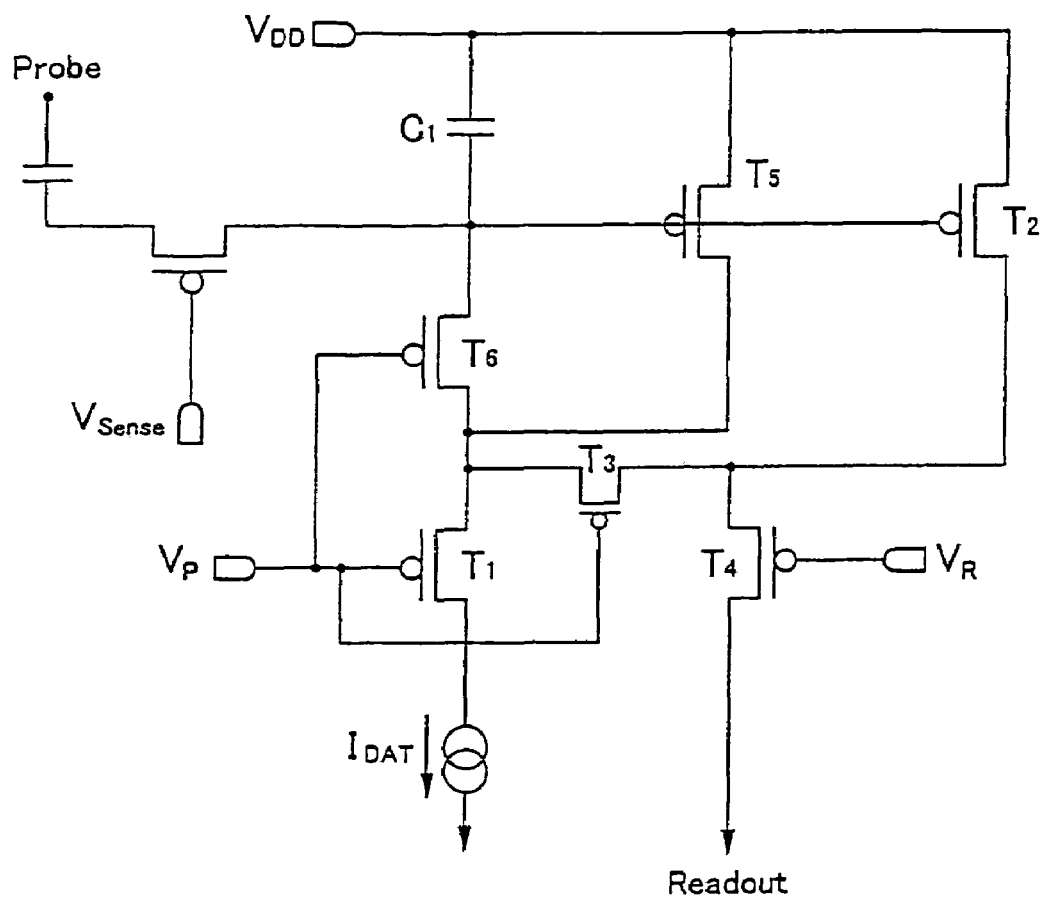
FIG. 17 illustrates an application of a driver circuit of the present invention to a capacitance sensor or a charge sensor.

FIG. 17 illustrates the application of the driver circuit of the present invention to a capacitance sensor or a charge sensor. In FIG. 17 a sense capacitor is indicated by the reference $C_{sense}$. The circuit of FIG. 17 is also applicable to other applications, such as a fingerprint sensor and a DNA sensor.

Figure 18:
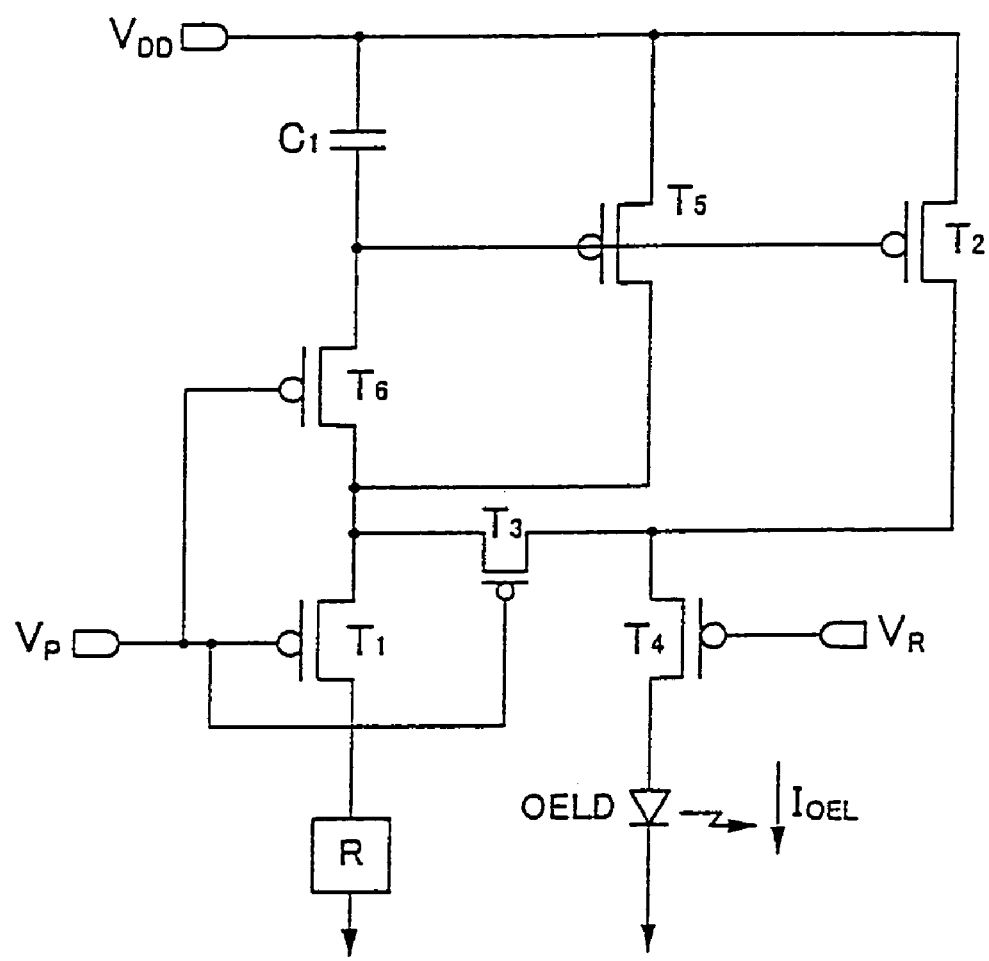
FIG. 18 illustrates an application of a driver circuit of the present invention to a night vision camera.

FIG. 18 illustrates the application of the driver circuit of the present invention to a night vision camera. In FIG. 18 a photoconductor is indicated by reference R.

In the embodiments illustrated with reference to the above specific description the transistors have been shown as p-channel transistors. This is not limiting of the present invention. For example, n-channel transistors may be used throughout the circuit, except for the drive transistor, which is retained as a p-channel transistor.

It will be apparent to persons skilled in the art that other variations and modifications can be made to the arrangements described with respect to FIGS. 3A to 18 without departing from the spirit and scope of the present invention.

What is claimed is:

1. An electronic circuit for driving a current driven element;
    a first transistor that has a first gate, a conduction state of the first transistor determining a current level of a driving current supplied to the current driven element;
    a second transistor that has a second gate;
    a capacitor that is coupled to the first gate and the second gate;
    a third transistor that has a third gate, the third transistor being disposed between the first gate and a first drain of the first transistor, the third transistor electrically connecting the first gate to the first drain during at least a part of a first period in which at least a part of a programming current determining a gate voltage of the first gate flows through the first drain and a first source of the first transistor during at least a part of the first period;
    a fourth transistor that has a fourth drain, a fourth source, and a fourth gate, the fourth transistor being disposed between the second gate and a second drain of the second transistor, the fourth transistor electrically connecting the second gate to the second drain during at least a part of the first period;
    the third transistor and the fourth transistor being controlled by an identical signal,
    at least a part of the programming current flowing through the second transistor during at least a part of the first period; and
    a reproduction current whose level corresponds to the gate voltage of the first gate determined during the first period flowing through the first transistor during at least part of a second period.

2. The electronic circuit according to claim 1, further comprising a fifth transistor that has a fifth gate, and the fifth gate being coupled to the capacitor.

3. The electronic circuit according to claim 2, an electrical connection between the fifth gate and a fifth drain of the fifth transistor during at least a part of the first period being controlled by the third transistor.

4. The electronic circuit according to claim 2, a current flowing through the fifth transistor being supplied to the current driven element.

5. The electronic circuit according to claim 1,
    a conduction state of the first transistor that corresponds to the gate voltage of the first gate determined during the first period determining a current level of a current supplied to the current driven element.

6. An electronic circuit for driving a current driven element;
    a first transistor that has a first drain, a first source, and a first gate;
    a second transistor that has a second drain, a second source, and a second gate;
    a capacitor that is coupled to the first gate and the second gate;
    a third transistor that has a third drain, a third source, and a third gate and that is disposed between and controls a first electrical connection between the first gate and one of the first drain and the first source;
    and a fourth transistor that has a fourth drain, a fourth source, and a fourth gate and that is disposed between and controls a second electrical connection between the second gate and one of the second drain and the second source,
    the third transistor and the fourth transistor being controlled by an identical signal.

7. The electronic circuit according to claim 6,
    the first transistor and the second transistor acting as diodes during a programming stage.

8. The electronic circuit according to claim 6,
    at least a part of a programming current flowing through the first transistor during at least a part of a first period,
    at least a part of the programming current flowing through the second transistor during at least a part of the first period,
    a reproduction current whose level corresponds to the gate voltage of the first gate determined during the first period flowing through the first transistor during at least a part of a second period, and
    one of the third transistor and the fourth transistor being in an off-state during at least a part of the second period.

9. An electronic device comprising:
    a plurality of data lines;
    a plurality of scanning lines; and
    a plurality of electronic circuits,
    each of the plurality of electronic circuit including:
    a first transistor that has a first gate;
    a second transistor that has a second gate;
    a capacitor that is coupled to the first gate and the second gate;
    a third transistor that has a third gate, the third transistor being disposed between the first gate and a first drain of the first transistor, the third transistor electrically connecting the first gate to the first drain during at least a part of a first period in which at least a part of a data current determining a gate voltage of the first gate flows throw the first drain and a first source of the first transistor during at least a part of the first period; and
    a fourth transistor that has a fourth drain, a fourth source, and a fourth gate, the fourth transistor being disposed between the second gate and a second drain of the second transistor, the fourth transistor electrically connecting the second gate to the second drain during at least a part of the first period,
    the third transistor and the fourth transistor being controlled by an identical signal.

10. The electronic device according to claim 9,
    the data current flowing to one data line of the plurality of data lines, and a part of the data current flowing through the first transistor, and
    a part of the data current flowing through the second transistor.

11. The electronic device according to claim 9, each of the plurality of electronic circuits further including a current driven element, a part of the data current flowing through the first transistor, and a part of the data current flowing through the second transistor, a driving current whose level corresponds to the gate voltage of the first gate during the first period being supplied to the current driven element during a second period, and no current flowing through the second transistor during the second period.

12. An electronic apparatus comprising the electronic device according to claim 9.

13. An electronic device comprising:
a plurality of data lines;
a plurality of scanning lines; and
a plurality of electronic circuits,
each of the plurality of electronic circuit including:
a first transistor that has a first gate, a first drain and a first source;
a second transistor that has a second drain, a second source, and a second gate;
a capacitor that is coupled to the first gate and the second gate;

a third transistor that has a third drain, a third source, and a third gate and that is disposed between and controls a first electrical connection between the first gate and one of the first drain and the first source; and a fourth transistor that has a fourth drain, a fourth source, and a fourth gate and that is disposed between and controls a second electrical connection between the second gate and one of the second drain and the second source, the third transistor and the fourth transistor being controlled by an identical signal.

14. The electronic device according to claim 13,
at least a part of a data current that determines a gate voltage of the first gate flowing through the first transistor during at least a part of a first period, a driving current whose level corresponds to the gate voltage of the first gate determined during the first period being supplied to a current driven element during a second period, and one of the third transistor and the fourth transistor being in an off-state during at least a part of the second period.

* * * * *